(12) United States Patent
Hashimoto

(10) Patent No.: US 7,611,925 B2
(45) Date of Patent: Nov. 3, 2009

(54) ELECTRONIC DEVICE AND METHOD OF MANUFACTURING THE SAME, CHIP CARRIER, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/987,502

(22) Filed: Nov. 30, 2007

(65) Prior Publication Data

US 2008/0136046 A1 Jun. 12, 2008

Related U.S. Application Data

(63) Continuation of application No. 10/788,447, filed on Mar. 1, 2004, now Pat. No. 7,320,902.

(30) Foreign Application Priority Data

Mar. 13, 2003 (JP) ............................ 2003-068281

(51) Int. Cl.
*H01L 21/20* (2006.01)

(52) U.S. Cl. ............. 438/108; 438/112; 438/113; 438/118; 438/613; 257/E21.505; 257/E21.511; 257/E21.519; 257/E23.021; 257/E23.067; 257/E25.013; 257/E29.022

(58) Field of Classification Search .. 438/108–116.613, 438/666; 257/E21.051, 503, 508, 512, E23.021, 257/67, 121, E25.013, E29.022
See application file for complete search history.

(56) References Cited

U.S. PATENT DOCUMENTS

| | | | |
|---|---|---|---|
| 5,550,408 A | 8/1996 | Kunitomo et al. | |
| 5,605,547 A * | 2/1997 | Lake | 29/25.01 |
| 5,786,639 A | 7/1998 | Takahashi | |
| 6,006,426 A * | 12/1999 | Kira et al. | 29/836 |
| 6,084,295 A | 7/2000 | Horiuchi et al. | |
| 6,413,790 B1 | 7/2002 | Duthaler et al. | |
| 6,426,021 B2 * | 7/2002 | Suga et al. | 252/513 |
| 6,599,777 B2 * | 7/2003 | Murakami | 438/108 |
| 6,621,172 B2 | 9/2003 | Nakayama et al. | |
| 6,625,032 B1 | 9/2003 | Ito et al. | |
| 6,737,750 B1 | 5/2004 | Hoffman et al. | |
| 6,798,072 B2 * | 9/2004 | Kajiwara et al. | 257/778 |
| 6,853,087 B2 * | 2/2005 | Neuhaus et al. | 257/778 |
| 7,122,897 B2 * | 10/2006 | Aiba et al. | 257/738 |
| 7,230,341 B2 * | 6/2007 | Hashimoto | 257/787 |
| 7,324,715 B2 * | 1/2008 | Tan et al. | 385/14 |
| 2002/0125557 A1 | 9/2002 | Chen et al. | |
| 2002/0151171 A1 | 10/2002 | Furusawa | |
| 2002/0171347 A1 | 11/2002 | Hirasawa et al. | |
| 2003/0039102 A1 * | 2/2003 | Yoshino et al. | 361/728 |

(Continued)

FOREIGN PATENT DOCUMENTS

CN 1187692 A 7/1998

(Continued)

*Primary Examiner*—Michael S Lebentritt
(74) *Attorney, Agent, or Firm*—Oliff & Berridge, PLC

(57) ABSTRACT

An external terminal is formed on an interconnect pattern formed on a substrate by using a soldering material. Subsequently, a chip component having an electrode is mounted on the substrate. An interconnect for electrically connecting the electrode and the interconnect pattern is formed at a temperature lower than a melting point of the soldering material.

6 Claims, 7 Drawing Sheets

U.S. PATENT DOCUMENTS

| | | |
|---|---|---|
| 2003/0060038 A1 | 3/2003 | Sirringhaus et al. |
| 2003/0099884 A1 | 5/2003 | Chiang et al. |
| 2004/0227238 A1 | 11/2004 | Hashimoto |
| 2004/0232540 A1 | 11/2004 | Hashimoto |

FOREIGN PATENT DOCUMENTS

| | | |
|---|---|---|
| JP | A-09-051020 | 2/1997 |
| JP | A 2000-216330 | 8/2000 |

* cited by examiner

ELECTRONIC DEVICE AND METHOD OF MANUFACTURING THE SAME, CHIP CARRIER, CIRCUIT BOARD, AND ELECTRONIC INSTRUMENT

This is a Continuation of U.S. patent application Ser. No. 10/788,447 filed on Mar. 1, 2004, which is hereby incorporated herein by reference in its entirety. This application claims priority to Japanese Patent Application No. 2003-068281 filed Mar. 13, 2003, which is hereby incorporated herein by reference in its entirety.

BACKGROUND OF THE INVENTION

The present invention relates to an electronic device and a method of manufacturing the same, a chip carrier, a circuit board, and also an electronic instrument.

With conventional chip-on-board (COB) mounting, the use of high-temperature processes makes it impossible to use a thermoplastic substrate, which makes it difficult to use an inexpensive substrate. In addition, since a semiconductor chip is subjected to high temperatures, it is difficult to avoid defects caused by the resultant stresses. Since the packaging process is also a high-temperature process, the formation of external terminals by using a soldering material must be done last, which dictates the fabrication sequence.

BRIEF SUMMARY OF THE INVENTION

A method of manufacturing an electronic device according to one aspect of the present invention includes:

forming an external terminal on an interconnect pattern formed on a substrate; and subsequently mounting a chip component having an electrode on the substrate, and forming an interconnect for electrically connecting the electrode and the interconnect pattern at a temperature lower than a melting point of the external terminal.

An electronic device according to another aspect of the present invention is manufactured by the above method.

A circuit board according to a further aspect of the present invention has the above electronic device mounted thereon.

An electronic instrument according to a still further aspect of the present invention has the above electronic device.

A chip carrier according to a yet further aspect of the present invention includes:

an external terminal formed of a soldering material, the external terminal being provided on an interconnect pattern formed on a substrate; and a region connected to an electrode which is included in a chip component.

DETAILED DESCRIPTION OF THE EMBODIMENT

An embodiment of the present invention may reduce the requirement of thermal resistivity of the substrate, enable a reduction in the generation of stresses in the semiconductor chip, and provide a fabrication sequence with more flexibility.

(1) A method of manufacturing an electronic device according to one embodiment of the present invention includes:

forming an external terminal on an interconnect pattern formed on a substrate; and subsequently mounting a chip component having an electrode on the substrate, and forming an interconnect for electrically connecting the electrode and the interconnect pattern at a temperature lower than a melting point of the external terminal.

Since this embodiment of the present invention makes it possible to perform the step of forming the interconnect at a temperature that is lower than the melting point of the soldering material, the requirement of thermal resistivity for the substrate is reduced, making it possible to reduce the generation of stresses in the chip component. In addition, the formation of the external terminal by using a soldering material is performed before the step of mounting the chip component, making it possible to provide a fabrication sequence with more flexibility.

(2) With this method of manufacturing an electronic device, the interconnect may be formed of a dispersant including electrically conductive particles.

(3) The method of manufacturing an electronic device may further include forming an insulating section adjacent to the chip component, and the step of forming the interconnect may include ejecting a dispersant including the electrically conductive particles over the insulating, section and the interconnect pattern.

(4) With this method of manufacturing an electronic device, the insulating section may be formed of a resin.

(5) With this method of manufacturing an electronic device, the insulating section may be formed to have an inclined surface descending in an outward direction from the chip component.

(6) With this method of manufacturing an electronic device, the chip component may be a semiconductor element.

(7) An electronic device according to another embodiment of the present invention is manufactured by the above method.

(8) A circuit board according to a further embodiment of the present invention has the above electronic device mounted thereon.

(9) An electronic instrument according to a still further embodiment of the present invention has the above electronic device.

(10) A chip carrier according to a yet further embodiment of the present invention includes:

an external terminal formed of a soldering material, the external terminal being provided on an interconnect pattern formed on a substrate; and a region connected to an electrode which is included in a chip component.

An embodiment of the present invention is described below with reference to the accompanying figures.

Figure 1:
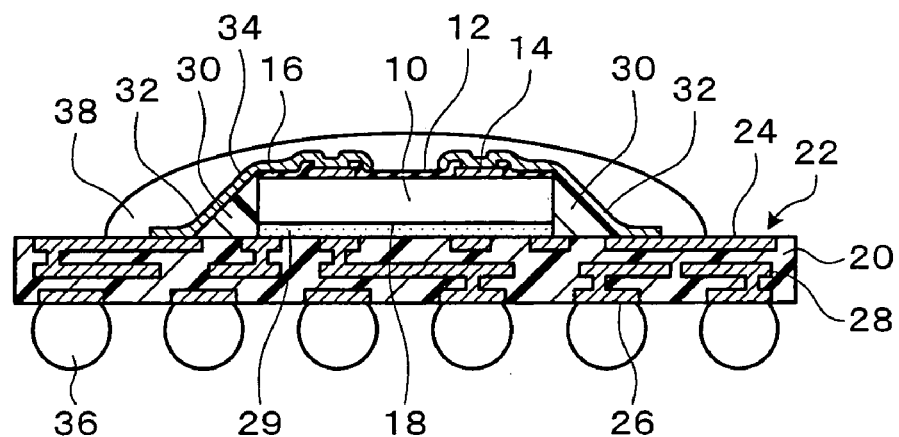
FIG. 1 is a sectional-view taken along the line I-I of FIG. 2.
Figure 2:
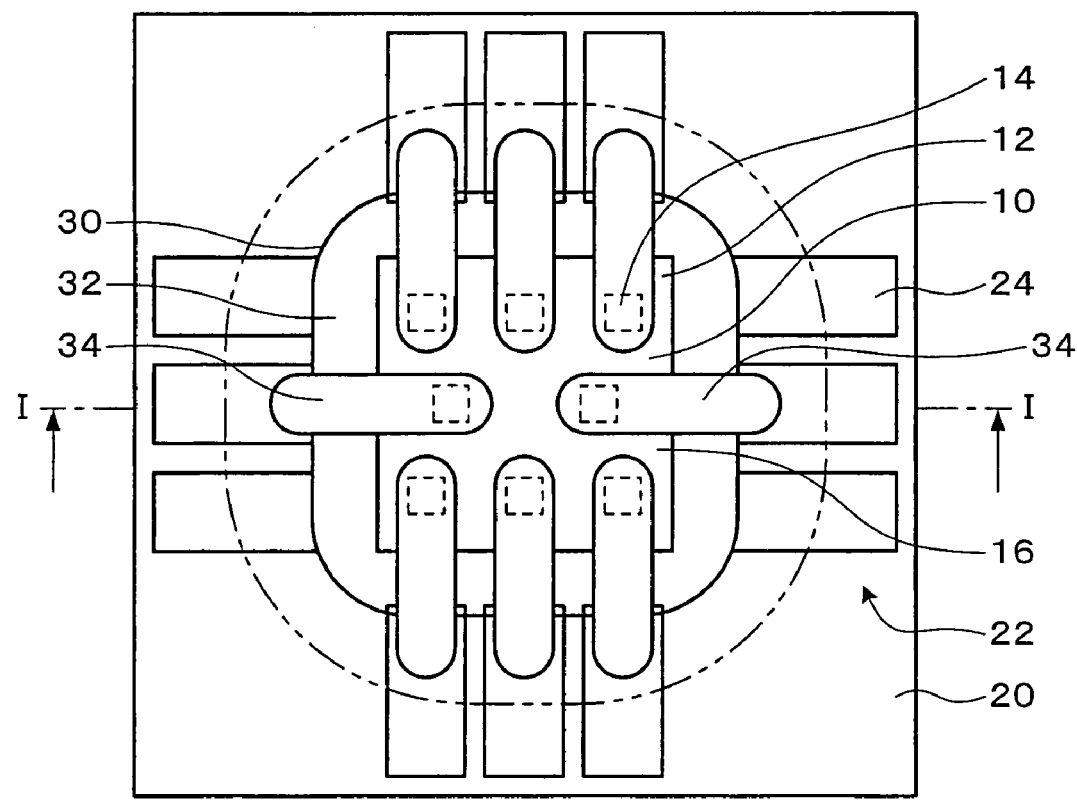
FIG. 2 is a plan view of an electronic device in accordance with an embodiment of the present invention.

An illustrative view of an electronic device in accordance with an embodiment of the present invention is shown in FIG. 1, as a sectional-view taken along the line I-I in FIG. 2. FIG. 2 is a plan view of the electronic device in accordance with this embodiment of the present invention.

The electronic device has a chip component 10. The chip component 10 could be an active component (such as an integrated circuit component) of a semiconductor component (such as a semiconductor chip), by way of example. An integrated circuit (not shown in the figures) could be formed in the chip component 10. If the chip component 10 is a semiconductor chip, the electronic device could be called a semiconductor device. The chip component 10 could also be a passive component (such as a resistor, capacitor, or inductor).

A plurality of electrodes 14 is formed on a first surface 12 of the chip component 10. The first surface 12 could be a quadrilateral (such as a rectangle). The plurality of electrodes 14 could be formed along a peripheral portion (edge portion) of the first surface 12. The plurality of electrodes 14 could be disposed along four edges of the first surface 12, or they could be disposed along two edges. At least one electrode 14 could be disposed at a central portion of the first surface 12.

A passivation film 16 including at least one layer could be formed on the first surface 12. The passivation film 16 is an electrically insulating film. The passivation film 16 could be formed solely of a material that is not a resin (such as $SiO_2$ or SiN), or it could further include a film of a resin (such as a polyimide resin) formed thereover. An aperture that exposes at least part of each electrode 14 (such as a central portion thereof) is formed in the passivation film 16. In other words, the passivation film 16 is formed to avoid at least the central portion of each electrode 14. The passivation film 16 could cover the edge portions of the electrode 14. The passivation film 16 could also be formed to cover the entire peripheral portion of the first surface 12.

Electrodes are not formed on a second surface 18 of the chip component 10 (on the surface opposite to that of the first surface 12). The second surface 18 could be in electrical contact with an integrated circuit (not shown in the figure), or it could be not connected thereto. A passivation film (electrically insulating film) could be formed on the second surface 18 or it could be omitted therefrom. The second surface 18 could be formed of a semiconductor (or conductor). A passivation film (electrically insulating film) could also be formed on the side surfaces of the chip component 10 (the surfaces other than the first and second surfaces 12 and 18) or it could be omitted therefrom. Electrodes are not formed on the side surfaces of the chip component 10. The side surfaces of the chip component 10 could also be formed of a semiconductor (or conductor).

The electronic device has a substrate 20. An interconnect pattern 22 is formed on the substrate 20. The interconnect pattern 22 includes an exposed portion 24 that reveals part of the surface of the substrate 20. An interconnect 34 for providing electrical connections between the chip component 10 and the interconnect pattern 22 is formed on the exposed portion 24. The exposed portion 24 could also have a land (a portion that is wider than a line; not shown in the figures).

The substrate 20 on which the interconnect pattern 22 is formed could be termed a wiring board. A wiring board could be a multi-layer board (including a two-sided board). A multi-layer board includes multiple (two or more) conductor patterns. In this case, the interconnect pattern 22 could also include a second exposed portion 26 that reveals a second surface on the opposite side from the surface that the exposed portion 4 reveals. The interconnect pattern 22 could also include a conductor pattern 28 within the substrate 20. The wiring board could also be a wiring board incorporated in a component. More specifically, passive components such as resistors, capacitors, and inductors or active components such as integrated circuit components could be connected electrically to the conductor pattern 28 within the substrate 20. Alternatively, part of the conductor pattern 28 could be formed into a resistor by forming it of a high-resistance material.

The chip component 10 is mounted on the substrate 20. The second surface 18 of the chip component 10 faces the substrate 20 (specifically, the surface on which the exposed portion 24 is formed). A connecting layer 29 could be interposed between the chip component 10 and the substrate 20. The connecting layer 29 could be formed of an adhesive. The exposed portion 24 and the second surface 18 of the chip component 10 can be connected electrically by making the connecting layer 29 electrically conductive. Alternatively, the exposed portion 24 and the second surface 18 of the chip component 10 can be isolated electrically by making the connecting layer 29 electrically insulating. The connecting layer 29 could be formed of a material that is an electrically insulating resin with electrically conductive particles dispersed therein.

The electronic device has an insulating section 30. The insulating section 30 is formed of a material that is electrically insulating (such as a resin). The insulating section 30 could be formed of a material that differs from that of the connecting layer 29. The insulating section 30 is provided adjacent to the chip component 10. The insulating section 30 could be provided so as to surround the chip component 10, or it could be provided only in a region adjacent to each electrode 14 of the chip component 10. The insulating section 30 could also be placed in contact with the side surfaces of the chip component 10. In other words, the configuration could be such that there is no space between the insulating section 30 and the chip component 10. In the example shown in FIG. 1, the insulating section 30 is provided in such a fashion that it does not surpass the height of the chip component 10. The upper edge of the insulating section 30 could be at the same height as the upper surface of the chip component 10 (the surface of the passivation film 16). In such a case, there is no step between the insulating section 30 and the chip component 10. The configuration could be such that only portions of the side surfaces of the chip component 10 that are formed of a semiconductor or conductor are covered with the insulating section 30. In such a case, the upper edge of the insulating section 30 is set lower than the upper surface of the passivation film 16.

The insulating section 30 has an inclined surface 32 that descends in the outward direction from the chip component 10. The thickest part of the insulating section 30 is positioned closest to the chip component 10 and the thinnest part thereof is positioned at the farthermost point from the chip component 10. The insulating section 30 could be formed over part of the interconnect pattern 22 (specifically, the exposed portion 24 thereof).

The electronic device has an interconnect 34. Part of the interconnect 34 is formed over each electrode 14. The interconnect 34 could also pass over the passivation film 16. The interconnect 34 passes over the insulating section 30. If the insulating section 30 is formed of a resin, the sealing between the insulating section 30 and the interconnect 34 is higher than that between the passivation film 16 and the interconnect 34. It is possible to prevent breakage of the interconnect 34 by minimizing the difference in height between the chip component 10 (such as the passivation film 16 thereof) and the insulating section 30. The interconnect 34 is formed so as to be above the interconnect pattern 22 (specifically, the exposed portion 24 thereof). In other words, the interconnect 34 connects the electrode 14 and the interconnect pattern 22 electrically.

The electronic device could be provided with a plurality of external terminals 36. Known packages that have such external terminals 36 are ball-grid array (BGA) packages and chip-size packages (CSP). Alternatively, another known type of package is a land-grid array (LGA) package that is not provided with the external terminals 36 but part of the interconnect pattern 22 (such as the second exposed section 26) forms an electrical connective portion with the exterior.

The electronic device could also have a sealing member 38. The sealing member 38 seals at least the electrical connective portion between the interconnect 34 and each electrode 14 and the electrical connective portion between the interconnect 34 and the interconnect pattern 22. The sealing member 38 could also seal in the chip component 10.

Figure 3A:
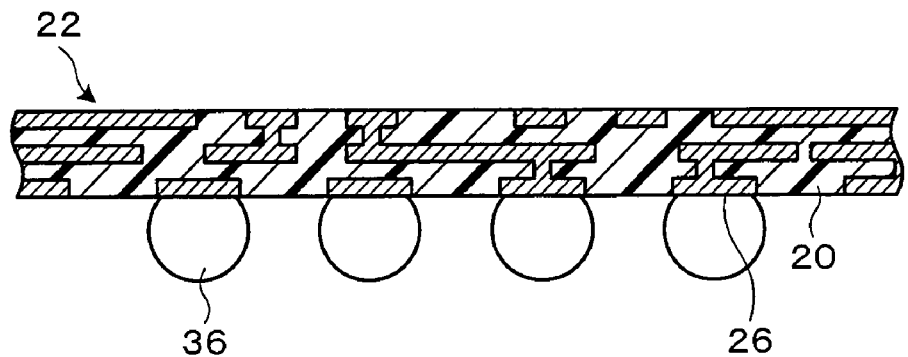
FIGS. 3A to 3C are illustrative of a method of manufacturing an electronic device in accordance with the present invention.
Figure 3B:
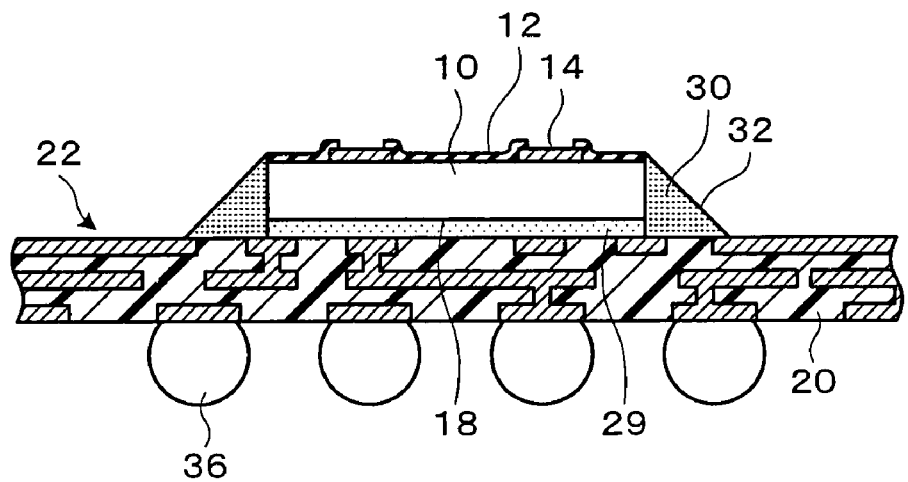
Figure 3C:
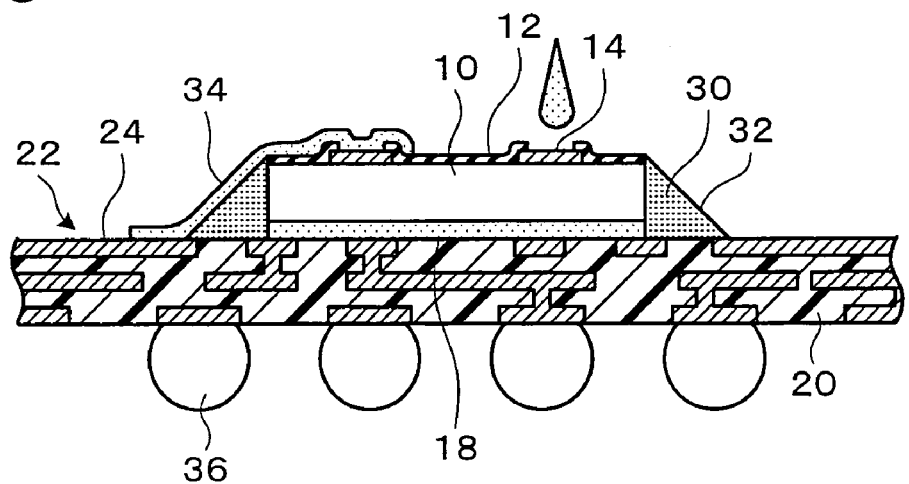

FIGS. 3A to 3C are illustrative of a method of manufacturing an electronic device in accordance with the present invention; this method of manufacturing an electronic device including the formation of the external terminals 36 shown in FIG. 3A. The external terminals 36 could be formed above the interconnect pattern 22 (such as the second exposed portion 26). The external terminals 36 could be formed of a soldering material. A soldering material is a metal (such as an alloy) which is electrically conductive and which is designed to create an electrical connection on melting. The soldering material could be either a soft solder having a melting point that is less than 450° C. or a hard solder having a melting point that is greater than 450° C. A solder that does not include lead (hereinafter called a lead-free solder) could be used as the soldering material. Many of the lead-free solders have melting points higher than that of solders including lead. A tin-silver (Sn—Ag), tin-bismuth (Sn—Bi), tin-zinc (Sn—Zn), or tin-copper (Sn—Cu) alloy could be used as the lead-free solder, and at least one of silver, bismuth, zinc, and copper could be added to that alloy. The external terminals 36 are provided on the substrate 20 before the chip component 10 is mounted.

Lands could be used as external terminals, such as in a land-grid array (LGA). In addition, bumps of an electrically conductive paste such as an electrically conductive resin, Au, or Au—Su could be used for the external terminals. Such a configuration enables the formation of a chip carrier as an independent function component.

As shown in FIG. 3B, the chip component 10 is mounted on the substrate 20. More specifically, the chip component 10 is mounted so that the second surface 18 thereof faces the substrate 20. An adhesive could be interposed between the substrate 20 and the chip component 10, to form the connecting layer 29. The step of mounting the chip component 10 on the substrate 20 is done at a temperature that is lower than the melting point of the external terminals 36.

The insulating section 30 is formed adjacent to the chip component 10. The insulating section 30 could be formed of a material that differs from the adhesive that forms the connecting layer 29. The insulating section 30 could be formed of a resin such as a polyimide resin, a silicone denatured polyimide resin, an epoxy resin, a silicone denatured epoxy resin, benzocyclobutene (BCB), or polybenzoxazole (PBO). The insulating section 30 is formed to have the inclined surface 32 that descends outward from the chip component 10. The insulating section 30 could also be formed to be in contact with the side surfaces of the chip component 10. The process of forming the insulating section 30 is preferably done at a temperature that is lower then the melting point of the external terminals 36.

As shown in FIG. 3C, the interconnect 34 is formed. The interconnect 34 is formed so as to extend from above each electrode 14, passing over the insulating section 30, and to above the interconnect pattern 22 (such as the exposed portion 24 thereof). The interconnect 34 could be formed of a dispersant including electrically conductive particles. An ink-jet method could be used therefor, by way of example. More specifically, a dispersant including electrically conductive particles could be ejected over the electrode 14, the insulating section 30, and the interconnect pattern 22 (such as the exposed portion 24), to form the interconnect 34. The process of forming the interconnect 34 could include the removal of the dispersant medium by drying the dispersant that includes the electrically conductive particles. The process of forming the interconnect 34 could also include the thermal decomposition of a coating material that covers the electrically conductive particles. The process of forming the interconnect 34 could also include a step of polymerizing the electrically conductive particles. The process of forming the interconnect 34 is preferably done at a temperature that is lower then the melting point of the external terminals 36.

Of the chip components that can be mounted in accordance with this embodiment, some of the components could be mounted on the substrate previously by another method (by soldering, for example). More specifically, the configuration could be such that passive parts (such as L-C or R) are previously mounted by solder, then only the semiconductor element is mounted by using the interconnect.

The sealing member 38 could be provided, as shown in FIG. 1. The sealing member 38 could be formed by a transfer mold or by potting. The sealing member 38 could also be omitted. The process of providing the sealing member 38 is preferably done at a temperature lower than the melting point of the external terminals 36.

Since this embodiment makes it possible to form the interconnect 34 at a temperature that is lower than the melting point of the external terminals 36, the requirement of thermal resistivity for the substrate 20 is reduced, enabling a reduction in the stresses generated in the chip component 10. In addition, if the interconnect is formed at below the melting point of the external terminals, the external terminals themselves can be used as holding members during the steps thereafter. The formation of the external terminals 36 by using a soldering material can be done before the step of mounting the chip component 10, making it possible to provide a fabrication sequence with more flexibility.

When the electrode 14 and the interconnect pattern 22 in accordance with this embodiment are connected electrically, it is possible to avoid using high-temperature heating such as that used during wire bonding or face-down bonding. The requirement that the substrate 20 should have thermal resistivity is therefore reduced, enabling a reduction in the stresses generated in the chip component 10. A general-purpose substrate can be used as the substrate 20, making it possible to route the interconnect 34 to suit the chip component 10 (such as the arrangement of the electrodes 14 thereof). In such a case, the interconnect 34 could connect different portions of the interconnect pattern 22, depending on the type of chip component 10.

FIGS. 4 to 13 show modifications of the electronic device in accordance with further embodiments of the present invention.

Figure 4:
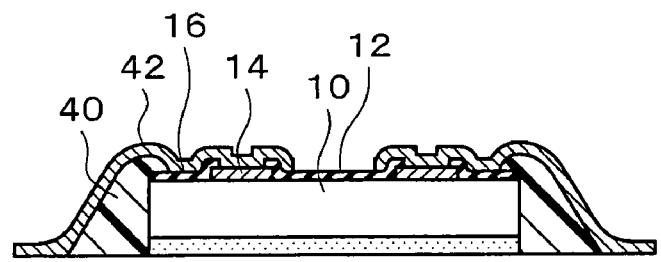
FIG. 4 shows a modification of the electronic device in accordance with an embodiment of the present invention.

In FIG. 4, an insulating section 40 is formed so that part thereof rises up over the first surface 12 of the chip component 10 (specifically, the passivation film 16 thereof). Part of the insulating section 40 overlays a portion closer to the peripheral side of the electrode 14 of the chip component 10. To prevent the electrode 14 being covered by the insulating section 40, the insulating section 40 could be made to stop at a position some distance from the electrode 14 (at a position nearer the periphery than the electrode). Alternatively, the insulating section 40 could be formed adjacent to the portion of the electrode 14 that is exposed from the passivation film 16. In such a case, the interconnect 42 does not overlay the passivation film 16 that has a low sealing capacity therewith. The insulating section 40 has a portion in contact with the chip component 10 that rises above the first surface 12. The rest of the configuration is the same as that of the electronic device of FIG. 1.

Figure 5:
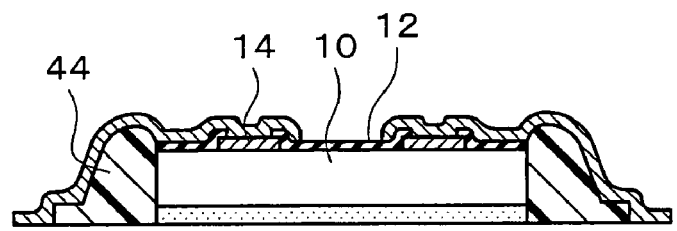
FIG. 5 shows another modification of the electronic device in accordance with an embodiment of the present invention.

In FIG. 5, an insulating section 44 is formed so that part thereof does not overlay the first surface 12 of the chip component 10. The insulating section 44 has a portion in contact with the chip component 10 that rises above the first surface 12. The insulating section 44 has a step-shaped portion on the side opposite to the chip component 10. The rest of the configuration is the same as that of the electronic device of FIG. 1.

Figure 6:
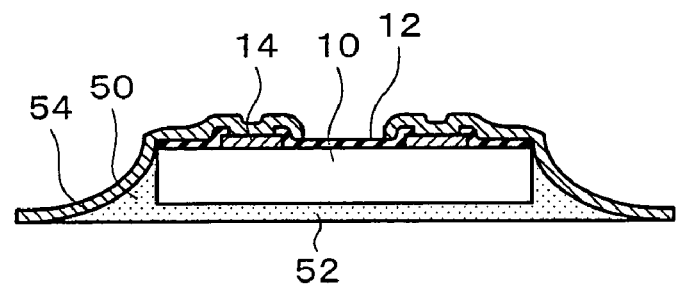
FIG. 6 shows a further modification of the electronic device in accordance with an embodiment of the present invention.

In FIG. 6, an insulating section 50 and a connecting layer 52 are formed integrally. The connecting layer 52 is formed of the same material as the insulating section 50. The insulating section 50 and the connecting layer 52 could be formed from an adhesive by providing an insulating adhesive between the substrate 20 and the chip component 10, then applying a compressive force between the substrate 20 and the chip component 10 so that the adhesive is pressed out to a region adjacent to the chip component 10. An inclined surface 54 of the insulating section 50 is a concave surface (such as a concave surface that draws a curve as seen in a section perpendicular to the first surface 12). The rest of the configuration is the same as that of the electronic device of FIG. 1. The configuration of FIG. 6 can also be used in other embodiments or modifications.

Figure 7:
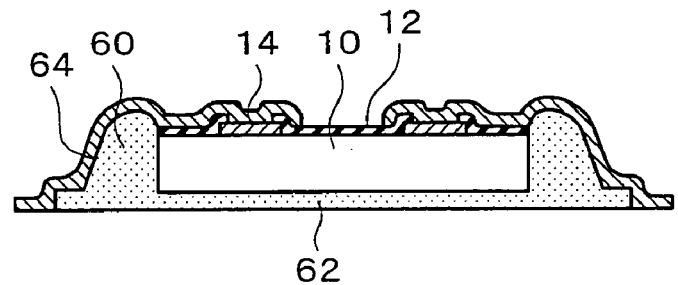
FIG. 7 shows a still further modification of the electronic device in accordance with an embodiment of the present invention.

In FIG. 7, an insulating section 60 and a connecting layer 62 are formed integrally. The connecting layer 62 is formed of the same material as the insulating section 60. The insulating section 60 and the connecting layer 62 could be formed from an adhesive by providing an insulating adhesive between the substrate 20 and the chip component 10, then applying a compressive force between the substrate 20 and the chip component 10 so that the adhesive is pressed out to a region adjacent to the chip component 10. An inclined surface 64 of the insulating section 60 is a convex surface (such as a convex surface that draws a curve as seen in a section perpendicular to the first surface 12). The rest of the configuration is the same as that of the electronic device of FIG. 1. The configuration of FIG. 7 can also be used in other embodiments or modifications.

Figure 8:
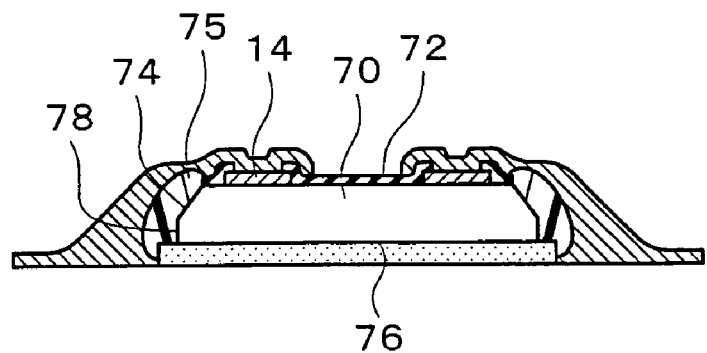
FIG. 8 shows a yet further modification of the electronic device in accordance with an embodiment of the present invention.

In FIG. 8, a chip component 70 has a side surface 74 that is inclined so as to descend in the outward direction from a first surface 72 thereof (a surface on which the electrodes 14 are formed). Since the side surface 74 is inclined, it is easy to provide an insulating section 75 with an inclined surface thereon. The chip component 70 could also include a side surface 78 that rises perpendicularly from the second surface 76 opposite to the first surface 72. The side surfaces 74 and 78 could also be connected. The rest of the configuration is the same as that of the electronic device of FIG. 1. The configuration of FIG. 8 can also be used in other embodiments or modifications.

Figure 9A:
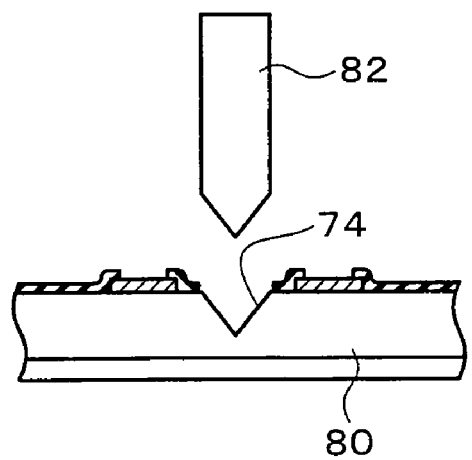
FIGS. 9A and 9B are illustrative of a method of manufacturing a chip component shown in FIG. 8.
Figure 9B:
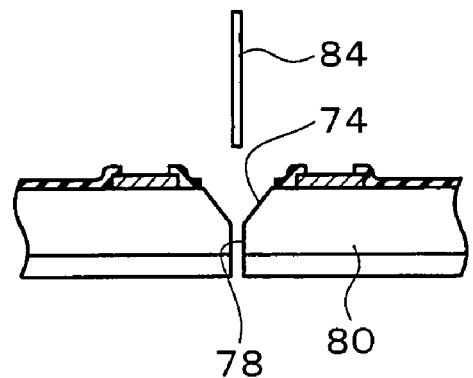

The side surface 74 could be formed when the wafer (such as a semiconductor wafer) 80 is cut apart, as shown in FIG. 9A. More specifically, a cutter (such as a dicing saw) 82 in which two slicing blades are connected at an angle like an angle milling cutter could be used to form a groove (such as a V-shaped groove) having inclined surfaces in the wafer 80, where these inclined surfaces become the side surfaces 74. After the groove has been formed, the base of the groove could be cut by a cutter (such as a dicing saw) 84 having a slicing blade along the external peripheral surfaces. This makes it possible to form the side surface 78 that rises perpendicularly from the second surface 76.

Figure 10:
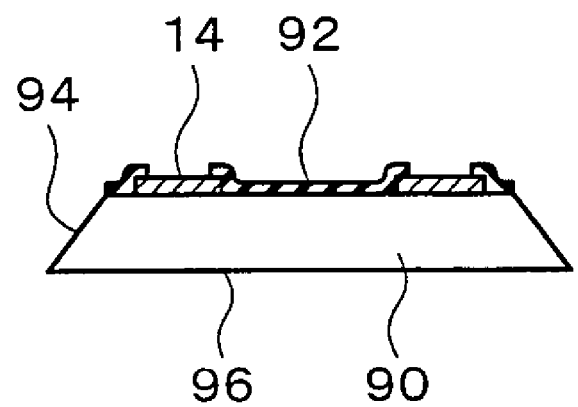
FIG. 10 shows a modification of the electronic device in accordance with an embodiment of the present invention.

In FIG. 10, a side surface 94 of a chip component 90 is inclined so as to descend in the outward direction from a first surface (a surface on which the electrodes 14 are formed) 92. The side surface 94 is also inclined with respect to a second surface 96 on the opposite side from the first surface 92. The rest of the configuration is the same as that of the electronic device of FIG. 1. The configuration of FIG. 10 can also be used in other embodiments or modifications.

Figure 11:
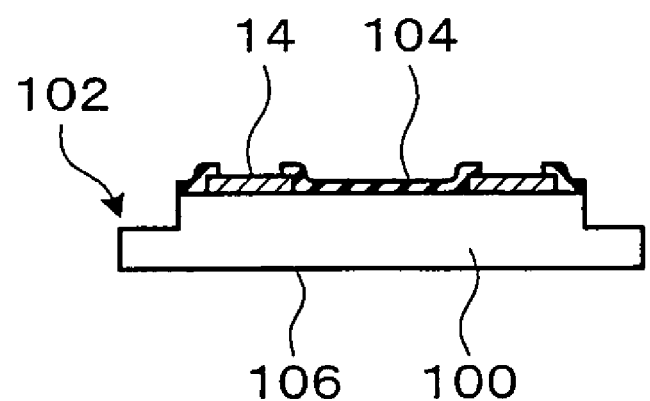
FIG. 11 shows another modification of the electronic device in accordance with an embodiment of the present invention.

In FIG. 11, an edge portion of a chip component 100 has a step 102. The step 102 includes a surface that descends (such as perpendicularly) from a first surface (a surface on which the electrodes 14 are formed) 104, a surface that rises (such as perpendicularly) from a second surface 106 opposite to the first surface 104, and a surface that extends in the lateral direction (such as parallel to either the first or second surface 104 or 106) to connect the other two surfaces. The rest of the configuration is the same as that of the electronic device of FIG. 1. The configuration of FIG. 11 can also be used in other embodiments or modifications.

Figure 12:
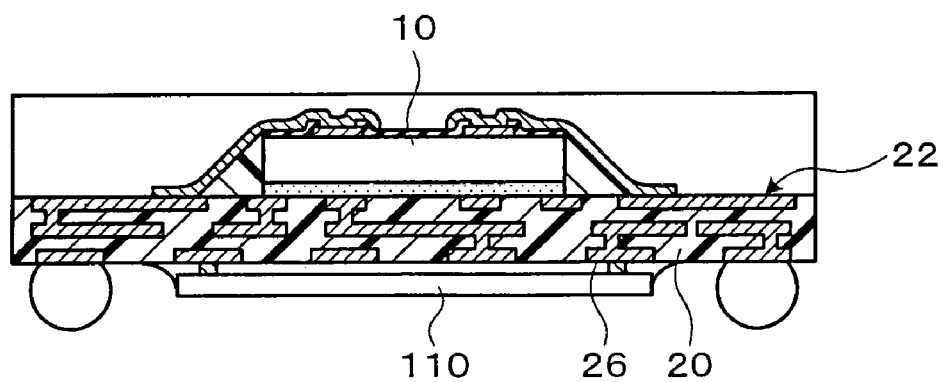
FIG. 12 shows a further modification of the electronic device in accordance with an embodiment of the present invention.

In FIG. 12, a second chip component 110 is mounted on a surface of the substrate 20 on the opposite side from the surface on which the component 10 is mounted. The second chip component 110 is connected electrically to the interconnect pattern 22 (specifically, the second exposed portion 26). The mounting state of the second chip component 110 could be either face-down bonding or face-up bonding. With face-down bonding, the electrodes (bumps) of the second chip component 110 face the interconnect pattern 22 and are electrically connected thereto. With face-up bonding, wires could be used to form the electrical connections. The rest of the configuration is the same as that of the electronic device of FIG. 1. The configuration of FIG. 12 can also be used in other embodiments or modifications.

Figure 13:
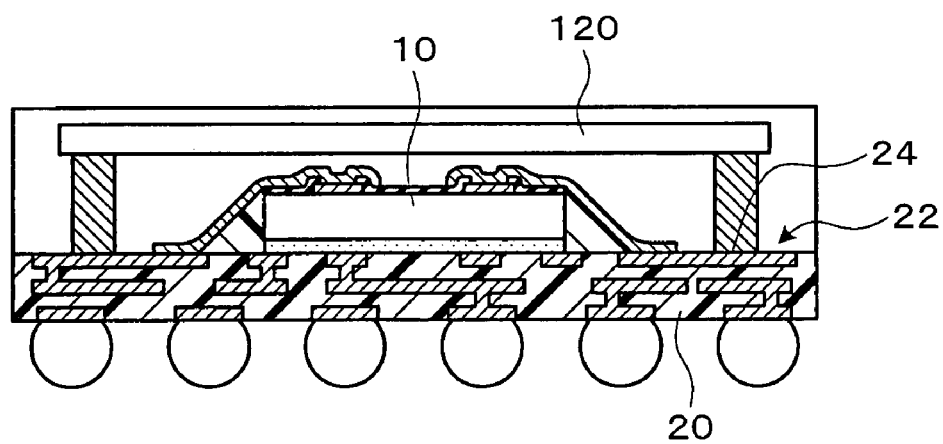
FIG. 13 shows a still further modification of the electronic device in accordance with an embodiment of the present invention.

In FIG. 13, a second chip component 120 is mounted on a surface of the substrate 20 on which the chip component 10 is mounted. The second chip component 120 could be disposed higher than the chip component 10 (or to cover the chip component 10), by way of example. The second chip component 120 is connected electrically to the interconnect pattern 22 (specifically, the exposed portion 24). The mounting state of the second chip component 120 could be either face-down bonding or face-up bonding. With face-down bonding, the electrodes (bumps) of the second chip component 120 face the interconnect pattern 22 and are electrically connected thereto. With face-up bonding, wires could be used to form the electrical connections. The rest of the configuration is the same as that of the electronic device of FIG. 1. The configuration of FIG. 13 can also be used in other embodiments or modifications.

Figure 14:
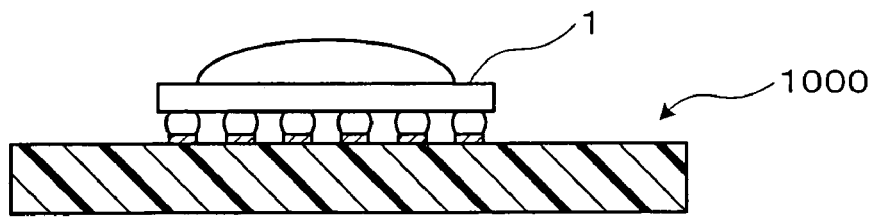
FIG. 14 shows a circuit board on which is mounted an electronic device in accordance with this embodiment.
Figure 15:
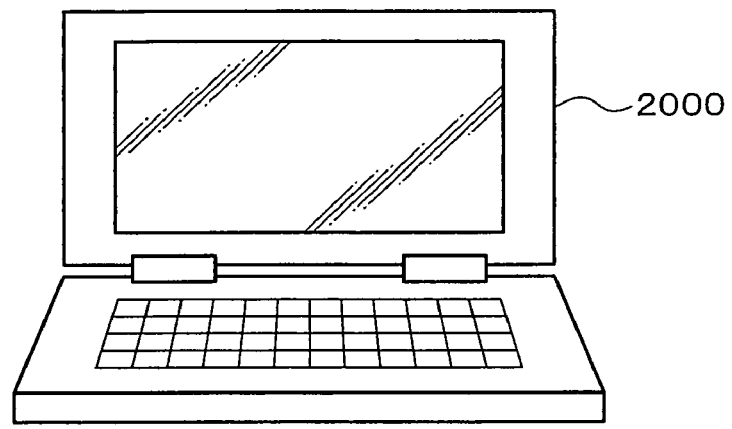
FIG. 15 shows an electronic instrument having an electronic device in accordance with this embodiment.
Figure 16:
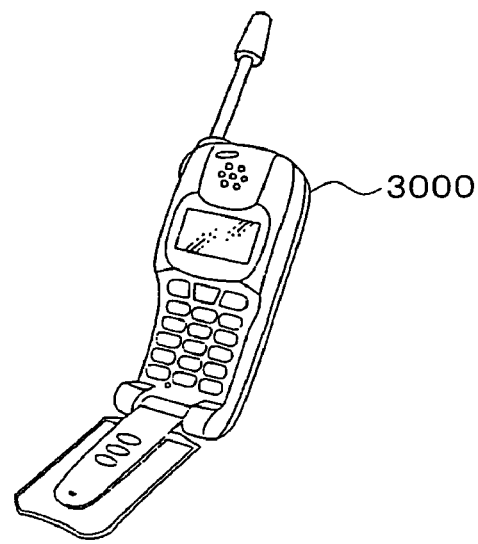
FIG. 16 shows another electronic instrument having an electronic device in accordance with this embodiment.

A circuit board 1000 on which is mounted an electronic device 1 as defined by any of the above-described embodiments is shown in FIG. 14. A notebook-type personal computer 2000 shown in FIG. 15 and a mobile phone 3000 shown in FIG. 16 are examples of electronic instruments having this electronic device.

The present invention is not limited to the above-described embodiments and thus various modifications thereto are possible. For example, the present invention also includes configurations that are substantially the same as the configurations described with reference to the embodiments herein (such as embodiments that have the same function, method, and effect or embodiments that have the same objective and effect). The present invention also includes the substitution of components that mentioned in a non-essential part of the description of the embodiments herein. Furthermore, the present invention also includes configurations that can achieve the same operating effect or the same objective as the embodiments described herein. The present invention further includes configurations wherein known techniques are added to the embodiments described herein.

What is claimed is:

1. A method of manufacturing an electronic device, the method comprising:

mounting a chip component above a substrate face up with an adhesive disposed between the substrate and the chip component, the chip component having an electrode on a first surface of the chip component opposite to a second surface facing the substrate;

forming an insulating section adjacent to the chip component by applying a force between the substrate and the chip component so that a portion of the adhesive is pressed out to a region adjacent to the chip component, the portion of the adhesive having a top higher from the substrate than the first surface, the insulating section formed of the portion of the adhesive; and forming an interconnect on the insulating section from the electrode to an interconnect pattern formed on the substrate for electrically connecting the electrode and the interconnect pattern.

2. The method of manufacturing an electronic device as defined by claim 1, wherein the interconnect is formed of a dispersant including electrically conductive particles.

3. The method of manufacturing an electronic device as defined by claim 2, wherein the forming of the interconnect includes ejecting the dispersant including the electrically conductive particles over the insulating section and the interconnect pattern.

4. The method of manufacturing an electronic device as defined by claim 1, further comprising:

forming an external terminal on the interconnect pattern formed on the substrate, wherein the forming of the interconnect is performed at a temperature lower than a melting point of the external electrode.

5. The method of manufacturing an electronic device as defined by claim 1, the forming of the interconnect being performed by inkjet.

6. The method of manufacturing an electronic device as defined by claim 1, wherein the chip component is a semiconductor element.

\* \* \* \* \*